United States Patent [19]

Streel

[11] 3,957,608
[45] May 18, 1976

[54] PROCESS FOR THE SURFACE OXIDISATION OF ALUMINUM

[75] Inventor: Dominique, Thomas, Francois, Leon Streel, Ougree, Belgium

[73] Assignee: Cockerill-Ougree-Providence et Esperance-Longdoz, en Abrege "Cockerill", Seraing, Belgium;

[22] Filed: Nov. 18, 1974

[21] Appl. No.: 525,448

[30] Foreign Application Priority Data
Jan. 15, 1974 Luxemburg............................ 69164

[52] U.S. Cl................................ 204/192; 118/49.1; 118/49.5; 29/196.2; 204/164; 204/298; 427/250
[51] Int. Cl.²...................... C23C 15/00; B23P 3/20; C23C 13/10
[58] Field of Search..................... 204/192, 298, 164; 29/196.2; 427/38, 39; 148/6.27

[56] References Cited
UNITED STATES PATENTS

| | | |
|---|---|---|
| 2,405,662 | 8/1946 | McManus et al................... 204/298 |
| 3,326,177 | 6/1967 | Taylor............................ 204/164 X |
| 3,355,371 | 11/1967 | Hile et al. .......................... 204/164 |
| 3,394,066 | 7/1968 | Miles ............................... 204/164 |
| 3,556,966 | 1/1971 | Waxman et al..................... 204/164 |
| 3,668,095 | 6/1972 | Katto et al.......................... 204/164 |
| 3,735,482 | 5/1973 | Norris et al..................... 204/164 X |
| 3,890,456 | 6/1975 | Dils..................................... 428/216 |

Primary Examiner—John H. Mack
Assistant Examiner—Aaron Weisstuch
Attorney, Agent, or Firm—Young & Thompson

[57] ABSTRACT

In the surface oxidisation of an aluminium coating deposited on a steel sheet there is provided a process in which the aluminium coated sheet is passed through an enclosure in which there is a vacuum of from $10^{-1}$ to $10^{-3}$ Torr and in which remains residual gas which is acted upon by an electrical field so as to form positive ions aimed at an aluminium target from which are removed aluminium atoms which combine with oxygen present in the enclosure so as to form alumina which is deposited in a layer on the surface of the aluminium coating.

7 Claims, 1 Drawing Figure

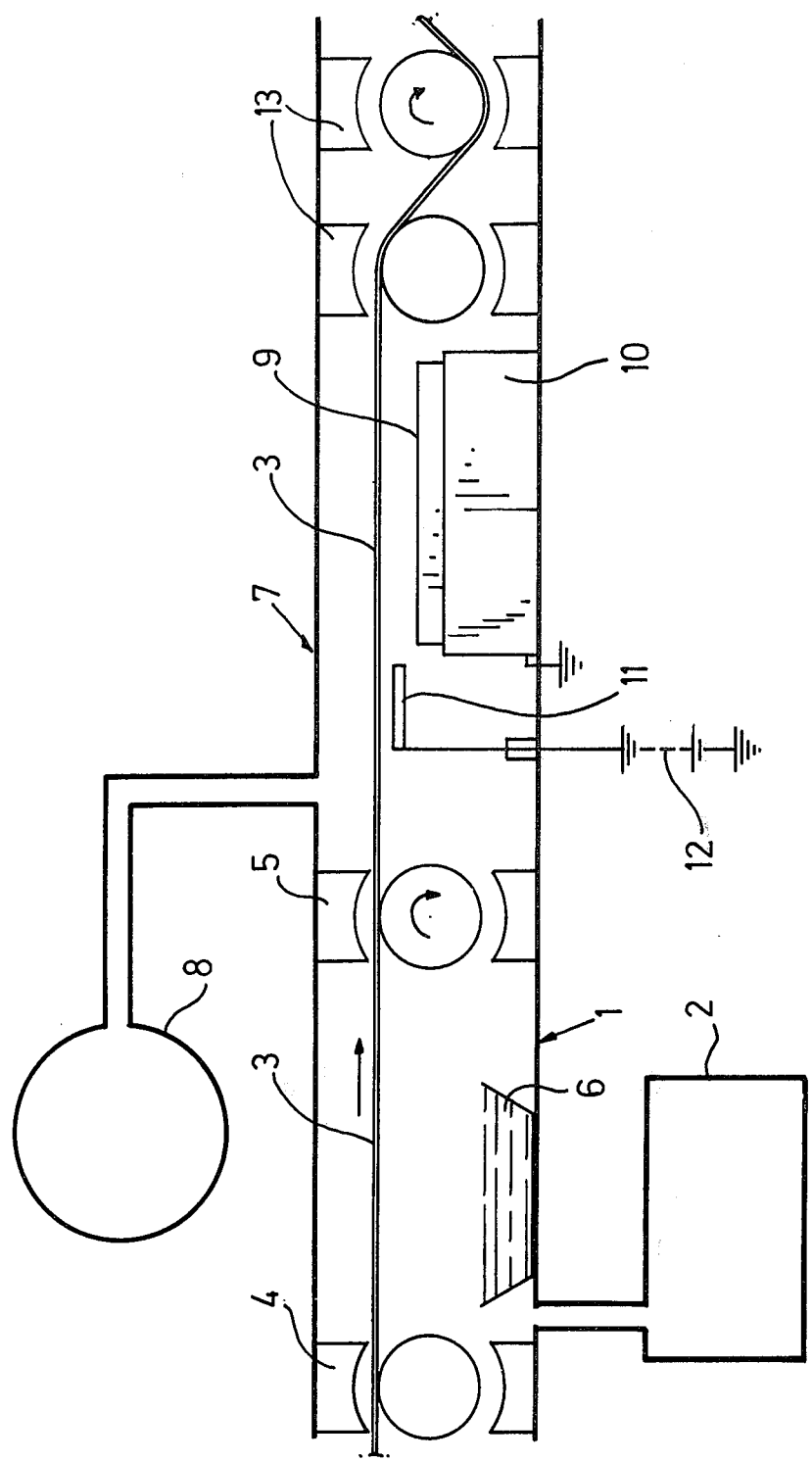

PROCESS FOR THE SURFACE OXIDISATION OF ALUMINUM

This invention relates to a process for the surface oxidisation of aluminium, and in particular to a process for the surface oxidisation of a coating of aluminium deposited on a steel sheet.

It is known that aluminium oxidises in free air, that is, aluminium is coated spontaneously with a layer of alumina which provides a protective layer against abrasion and corrosion. However, the layer of alumina formed under normal conditions in free air is of very small thickness of approximately 0.1 microns; moreover the alumina layer may be irregular.

To overcome these disadvantages, the aluminium surface may be subjected to anodic oxidisation. Although this process renders it possible to form alumina layers of considerable thickness up to approximately 20 microns on aluminium, the process is, however, uneconomical; moreover alumina layers of this thickness are deformable only to a small degree.

A continuous anodic oxidisation process by the wet method is also known, by which it is possible to obtain a layer of alumina of approximately 2 to 5 microns thickness which is deformable without deteriorating, whereby it is possible to readily deform the substrate even after forming the alumina layer.

This process is applied in particular to continuous strips of aluminium which are unwound to pass through a bath and are then re-wound; it is thus possible to obtain aluminium sheets which are highly resistant against corrosion and abrasion and which may be readily deformed for subsequent use. However, aluminium sheets thus anodised suffer from the disadvantage of having intrinsically low mechanical strength and thus frequently have inadequate rigidity.

It is also known to coat a steel sheet with a thin layer of aluminium, for example by rolling together of plates of steel and aluminium, or by aluminium plating, or by volatilisation under vacuum, and then to subject the coating of aluminium to anodic oxidisation.

Since this aluminium coating is imperfect and incomplete, often leaving bare points or areas of the steel sheet such as at the edges and porous areas, the application of the anodic oxidisation process by the wet bath method cannot be performed without difficulty since the acid baths through which the sheet pass attack the iron, forming iron sulphate which poisons the bath solutions and may even completely inhibit the anodic oxidisation reaction in sufficient concentration.

Accordingly there is a danger of polluting the acid baths, and since these baths are used in large quantities and use costly solutions, the application of the wet bath method of anodic oxidisation of steel sheet coated with aluminium is usually carried out reluctantly. This process does, however, have the advantage of providing a deformable layer of alumina.

The present invention in one aspect provides a process for the surface oxidisation of an aluminium coating deposited on a steel sheet, comprising passing the aluminium coated sheet through an enclosure in which is a vacuum of from $10^{-1}$ to $10^{-3}$ Torr and in which remains a residual gas which is acted upon by an electrical field which forms positive ions aimed at an aluminium target for removing from the latter aluminium atoms which combine with oxygen which is also present within the enclosure to form alumina which is deposited in a layer on the surface of the aluminium coating.

The process according to the invention for oxidisation of aluminium deposited on a steel sheet does not require the use of costly and sensitive solutions, and gives a thin layer of alumina able to withstand without damage subsequent deformation of the sheet.

The coated sheet and the target may be independent and separate from each other, in which case the target is suitably a pure aluminium block; alternatively the target may be formed by the aluminium coating deposited on the steel sheet.

When the coated sheet and the target are separate, the sheet preferably passes the target at a distance which is small but which exceeds 50 mm, for example at approximately 100 mms.

The invention will be further described, by way of example only, with reference to the accompanying drawing, which is a diagrammatical view of a plant for the production of a steel sheet having an anodised aluminium coating.

The plant shown in the drawings comprises an enclosure 1 wherein a vacuum of $10^{-4}$ Torr is generated by pumping means 2. In known manner, the enclosure 1 forms an enclosure for depositing aluminium originating from a heated vessel 6 onto a sheet 3 which enters the enclosure via a lock 4 and emerges from the enclosure via a lock 5. The sheet 3 then passes directly into an enclosure 7 positioned immediately after the enclosure 1. A vacuum of from $10^{-1}$ to $10^{-3}$ Torr is generated in the enclosure 7 by a vacuum pump 8. In the enclosure 7 remains a residual gas consisting of argon and oxygen under a partial pressure of approximately $10^{-1}$ Torr. The sheet 3 moves continuously forward and passes at a distance of approximately 100 mms from a block 9 of pure aluminium carried by an earthed metal support 10. The sheet 3, which advances at a speed of approximately 15 m/sec, is also earthed.

An intense continuous electrical field is established within the enclosure 7 by means of anodes 11 connected to a source 12 of high voltage. As a result of this electrical field, the residual argon atoms are positively ionised and directed at high speed against the target formed by the block of aluminium 9 from which they release aluminium atoms which are emitted in a highly reactive electronically energised state. These energised atoms are thus aimed at the sheet 3 from the target 9, and along this trajectory the energised atoms contact the oxygen present in the enclosure 7 and, because of their energised state, combine with the latter to form alumina $Al_2O_3$ which is deposited in a layer on the aluminium coating. A sheet having an oxidised aluminium coating thus emerges from the enclosure 7 via a lock 13.

The process is particularly advantageous since it does not require any baths and provides an alumina deposit of approximately 0.5 microns thickness which has excellent compactness and a high resistance against abrasion.

An advantage of this oxidisation process is that it is possible to make use of the vacuum required for the aluminium coating operation to perform the oxidisation, which is particularly economical; moreover the aluminium thus deposited is very pure and highly reactive. The sheet emerging from the plant has a coating of anodised aluminium of very good quality.

In a modified form of the present oxidisation process, the aluminium deposit of the sheet may be used as a target and aluminium atoms are released by means of the argon ions from the same. The released aluminium atoms are oxidised by the oxygen in the enclosure, and the alumina formed is re-deposited on the sheet.

What I claim is:

1. A process for the surface oxidisation of an aluminium coating deposited on a steel sheet, comprising passing the aluminium coated sheet through an enclosure, generating a vacuum of from $10^{-1}$ to $10^{-3}$ Torr in said enclosure in which remains a residual gas consisting of argon and oxygen, having an aluminium target in said enclosure, creating an intense continuous electrical field in said enclosure so as to form positively ionised argon atoms which are aimed at said aluminium target for removing from the latter aluminium atoms which combine with oxygen present within said enclosure to form alumina which is deposited in a layer on said aluminium coating.

2. A process as claimed in claim 1 wherein the coated sheet and the target are independent and separate from each other.

3. A process as claimed in claim 2 wherein the target is a block of pure aluminium.

4. A process as claimed in claim 2 wherein the sheet passes the target at a distance which is approximately 100 mms.

5. A process as claimed in claim 1 wherein the target comprises the aluminium coating deposited on the steel sheet.

6. A process as claimed in claim 1, in which said aluminium coating is deposited on said steel sheet in an enclosure from which said sheet passes immediately into the first-mentioned enclosure, the two enclosures being immediately adjacent each other.

7. A process as claimed in claim 6, the sheet being in the form of a continuous strip that runs through both enclosures.

* * * * *